United States Patent [19]
Welty

[11] Patent Number: 5,269,898
[45] Date of Patent: Dec. 14, 1993

[54] APPARATUS AND METHOD FOR COATING A SUBSTRATE USING VACUUM ARC EVAPORATION

[75] Inventor: Richard P. Welty, Boulder, Colo.

[73] Assignee: Vapor Technologies, Inc., Boulder, Colo.

[21] Appl. No.: 809,727

[22] Filed: Dec. 17, 1991

Related U.S. Application Data

[63] Continuation-in-part of Ser. No. 673,135, Mar. 20, 1991, abandoned.

[51] Int. Cl.$^5$ ............................................. C23C 14/22
[52] U.S. Cl. .......................... 204/298.41; 204/192.38
[58] Field of Search ................... 204/192.38, 298.41; 118/723

[56] References Cited

U.S. PATENT DOCUMENTS

| | | | |
|---|---|---|---|
| 4,492,845 | 1/1985 | Kljuchko et al. | 219/121 P |
| 4,673,477 | 6/1987 | Ramalingam et al. | 204/192.38 |
| 4,724,058 | 2/1988 | Morrison, Jr. | 204/192.38 |
| 4,849,088 | 7/1989 | Veltrop | 204/298 |
| 5,037,522 | 8/1991 | Vergason | 204/298.41 |

Primary Examiner—Nam Nguyen
Attorney, Agent, or Firm—William E. Hein

[57] ABSTRACT

An apparatus and method are described for depositing a coating onto a substrate using vacuum arc evaporation from a substantially cylindrical cathode. An axial magnetic field is disclosed to force the motion of the arc into an open helical trajectory on the cathode surface. Means are also provided for controlling the speed and direction of the arc along the cathode by varying the division of input current between the ends of the cathode. Improved uniformity of cathode erosion and coating thickness are thereby achieved, along with a reduction in the number and size of splattered droplets incorporated into the coating.

19 Claims, 7 Drawing Sheets

APPARATUS AND METHOD FOR COATING A SUBSTRATE USING VACUUM ARC EVAPORATION

REFERENCE TO RELATED APPLICATION

This application is a continuation-in-part application of my copending U.S. patent application Ser. No. 07/673,135 filed on Mar. 20, 1991, abandoned, the subject matter of which is incorporated herein by reference.

BACKGROUND AND SUMMARY OF THE INVENTION

This invention relates generally to coating of substrates using vacuum arc evaporation and more particularly to an improved method and apparatus that employs a cylindrical metallic cathode and a magnetic field to force the motion of an arc into an open helical trajectory on the surface of the cylindrical cathode and to control the speed of movement of the arc. Vacuum arc evaporation has in the last decade or so come into wide commercial use for deposition of metal, alloy, and metal compound coatings. A cathode composed of the material to be deposited is vaporized by a high current, low voltage arc plasma discharge in a vacuum chamber which has been evacuated to a pressure of typically $10^{-4}$ Torr or less. The substrates to be coated are placed in the vacuum chamber facing the evaporable surface of the cathode, at a distance of typically 10–50 cm. Typical arc currents range between 25 and 500 amperes, with voltages between 15 and 50 volts.

The arc plasma discharge conducts electric current between two electrodes in the vacuum chamber, through the metal vapor plasma created by vaporization and ionization of the cathode material by the arc. The cathode, or negative electrode, is an electrically isolated structure which is at least partially consumed during the process. The anode, or positive electrode, may be an electrically isolated structure within the vacuum chamber, or it may be the metal vacuum chamber itself, and is not consumed in the process. An arc is struck on the evaporable surface of the cathode by means of mechanical contact, high voltage spark, or laser irradiation. The ensuing arc plasma discharge is highly localized in one or more mobile arc spots on the cathode surface, but is distributed over a large area at the anode. The extremely high current density in the arc spot, estimated to be $10^6-10^8$ amperes/cm$^2$, results in local heating, evaporation, and ionization of the cathode material. Each arc spot emits a jet of metal vapor plasma in a direction approximately perpendicular to the cathode surface, forming a luminous plume extending into the region between the cathode and anode, where the substrates to be coated are disposed. The metal vapor condenses on the substrate surface, forming a dense coating. Reactive gases may be introduced into the vacuum chamber during the evaporation process, resulting in the formation of metal compound coatings on the substrate surface.

Below 70-100 amperes of arc current, depending on the material, only a single arc spot will exist. At higher arc currents, multiple arc spots exist simultaneously, each carrying an equal fraction of the total arc current. An arc spot, in the absence of applied magnetic fields, tends to move rapidly and semi-randomly around the target surface, leaving a trail of microscopic crater-like features on the target surface. Although the small-scale motion of the arc is a semi-random jumping from crater site to crater site, the electromagnetic force due to the interaction between the current in the arc jet and any magnetic field present at the cathode surface has a dominant influence on the large-scale average movement of the arc spot. An externally applied magnetic field causes a force on the arc jet in a direction perpendicular to both the field lines and the jet. In the absence of an applied magnetic field, the interaction of the current in the arc jet with the self magnetic field due to the arc current flowing through the cathode can tend to draw the arc spot toward the current input, if the current flow through the cathode is asymmetrical. It is interesting to note that the direction of the motion of the arc in a magnetic field is opposite or retrograde to the vector $J \times B$ direction expected based on Ampere's law, considering the current to be in the same direction as in the external circuit. This phenomenon has been widely reported and discussed, and is believed to be caused by complex dynamic effects within the arc jet.

An undesirable side effect of the vaporization of target material at the arc spot is the generation of droplets of molten target material, which are ejected from the target by the reaction forces due to expansion of the vapor jet. These droplets are called macroparticles, and range in diameter from sub-micron to tens of microns. The macroparticles become imbedded in the coating when they land on the substrate, forming objectionable irregularities. Various strategies have been devised to reduce generation of macroparticles or prevent their arrival at the substrate.

Several techniques are known in the prior art for depositing a coating onto a substrate. U.S. Pat. No. 2,972,695 describes a magnetically stabilized vacuum arc evaporation apparatus. U.S. Pat. Nos. 3,625,848 and 3,836,451 describe an arc evaporation apparatus with particular electrode configurations and also teach the use of a magnetic field to increase the evaporation rate and to direct ions to the substrate. U.S. Pat. Nos. 3,793,179 and 3,783,21 describe particular configurations of electrodes and shields, as well as the use of a magnetic field activated whenever the arc spot moves off the desired evaporation surface of the cathode.

U.S. Pat. Nos. 4,724,058, 4,673,477, and 4,849,088 describe arc evaporation apparatus using a magnetic field in the shape of a closed loop tunnel, which confines the arc spot to a closed loop "racetrack" trajectory at a fixed location on the cathode surface. The means required to generate such a magnetic field are widely known in the art of planar magnetron sputtering. In order to uniformly erode the entire target surface, it is necessary to move the magnetic field generating means to move the arc trajectory over the target surface, either by mechanical movement of the magnet means as described in U.S. Pat. Nos. 4,673,477 and 4,849,088, or by use of multiple electromagnets, as described in U.S. Pat. No. 4,724,058.

U.S. Pat. Nos. 4,609,564, 4,859,489, and 5,037,522 describe the use of a cathode in the form of a long cylinder or rod, which makes use of the self magnetic field of the arc current to force motion of the arc along the length of the cathode. None of these prior art references shows or suggests a magnetic field means to generate an axial magnetic field component over the cathode surface in order to force the arc to rotate around the cathode as it travels down the length, nor do these references teach any means to increase or control the speed of the arc. It is disclosed in U.S. Pat. No. 5,037,522 that the direction of travel of the arc on the cathode may be reversed by switching the power supply connection from one end of the cathode to the other.

U.S. Pat. No. 4,492,845 describes an arc evaporation apparatus using an annular cathode, in which the evaporable surface is the outer wall, facing a cylindrical anode of larger diameter and greater length than the cathode. The substrates to be coated are disposed inside the annular cathode, not facing the evaporable surface. A coaxial magnetic field is described for diverting charged particles of evaporated material away from the anode and back toward the substrate to be coated.

In accordance with the illustrated preferred embodiments of the present invention, a means is provided to control the speed and path of motion of an arc discharge on a cathode having substantially cylindrical shape, especially a long rod or tube, by application of a magnetic field in the region of the cathode. By controlling the motion of the arc, it is possible to achieve more uniform erosion of the cathode, and hence more uniform deposition onto the substrates than is possible with the random arc movement taught by the prior art. By controlling the speed of the arc, it is possible to minimize generation of macroparticles which roughen the coating.

The motion of an arc on a cylindrical surface may be described as the vector sum of a circumferential component of motion around the circumference of the cylinder, and a longitudinal component motion along its length (parallel to the cylindrical axis). Likewise, the magnetic field of the present invention may be described as the vector sum of circumferential and axial (longitudinal) magnetic field components. Since the force on the arc jet and the magnetic field (the current in the arc jet being primarily perpendicular to the cathode surface), the circumferential component of arc motion is caused by the longitudinal component of the magnetic field, and vice versa.

It is therefore an object of the present invention to superimpose onto the average arc motion a component around the circumference of the cylindrical cathode by application of an axial magnetic field component parallel to the cylindrical axis of the cathode. Under the influence of this axial field component, the arc rotates around the cathode as it travels down the length, the net trajectory forming an open helix.

A further object of the present invention is to control the circumferential velocity, i.e. the speed of rotation, by varying the strength of the applied axial magnetic field component. The magnetic field increases the velocity of the arc motion, thereby reducing macroparticle generation by reducing the amount of time the arc spends in each crater along its track. Experiments have shown that the number and size of macroparticles can be reduced by at least 50% using moderate magnetic fields (1–50 gauss) for at least several cathode materials.

A further object of the present invention is to control the speed and direction of the longitudinal component of the arc motion by controlling the circumferential component of the magnetic field present at the location of the arc spot on the cathode surface. The circumferential magnetic field in the present invention consists of the sum of the self magnetic field due to the arc current flowing through the cathode to the arc spot, and an optional applied circumferential field component due to a variable control current through the cathode, which is supplied independent of the arc current.

If an arc power supply is connected to one end of a rod-shaped cathode in the absence of the applied axial magnetic and circumferential magnetic fields of the present invention, as described in U.S. Pat. No. 4,859,489, and an arc spot is initiated at the end of the cathode opposite from the power supply connection, the arc spot will travel down the length of the cathode under the influence of the self magnetic field of the arc current, in a somewhat random but basically linear path toward the end of the cathode to which the power supply is connected. It is known in the prior art to reverse the direction of travel of the arc along the cathode by switching the power supply connection from one end of the cathode to the other. This method, however, provides no control of the longitudinal speed of the arc motion, since the circumferential magnetic field component which causes the longitudinal motion is due to the arc current, and cannot be varied independent of the arc current.

Control of the strength of the circumferential magnetic field component, and thus control of the longitudinal speed of the arc spot, may be accomplished in accordance with the present invention by either of two methods. In the first method, an arc power supply is connected to both ends of the cathode simultaneously, and a means is provided to control the fraction of the arc current which is supplied to each end of the cathode, while maintaining the total arc current constant between cathode and anode. The net circumferential magnetic field component at the location of the arc spot along the cathode length will then be a function of the division of arc current between the two ends of the cathode. If the current division is balanced, i.e. half the arc current is fed to each end of the cathode, there is no tendency for the arc to move along the length of the cathode, but it will still rotate around the circumference at an independently controllable speed due to the axial magnetic field component of the present invention. If the currents fed to the ends of the cathode are unbalanced, then the arc will move along the length of the cathode toward whichever end is receiving more current, at a speed proportional to the degree of imbalance in the current feed. The arc may thus be forced to rotate around the cathode at a predetermined speed, and be scanned slowly from one end of the cathode to the other at a speed independent of the total arc current, which may be maintained at a constant value.

In the second method of the present invention for controlling the strength of the circumferential magnetic field component, the negative output of an arc power supply is connected to both ends of the cathode simultaneously, such that substantially equal arc current flows to each end, and a circumferential magnetic field component is created over the cathode surface which is independent of the arc current flowing between cathode and anode. This independent circumferential field can be created by connecting an additional power supply to the two ends of the cathode to pass a control current through the cathode from one end to the other, with means provided to adjust the magnitude and polarity of the control current. When this control current through the cathode is zero, the arc has no tendency to move along the length of the cathode, since the net circumferential field is zero due to the balanced manner in which the arc current is supplied to both ends of the cathode. To force the arc to move in one direction or the other along the cathode, a circumferential field is applied at the cathode surface by passing control current through the cathode in the appropriate direction. Since the control current power supply is not part of the cathode-anode circuit, changes in the magnitude or polarity of the control current have no effect on the arc current, which remains constant. This method for control of the longitudinal arc motion has the advantage that the strength of the circumferential magnetic field component can be made greater than the field which would exist from the arc current along. This allows the arc velocity alone the cathode surface to be increased, reducing macroparticle generation, and insures that the arc can be made to move along the cathode length even at low arc currents and in the presence of a strong axial magnetic field component.

DETAILED DESCRIPTION OF THE PREFERRED EMBODIMENTS

Figure 1:
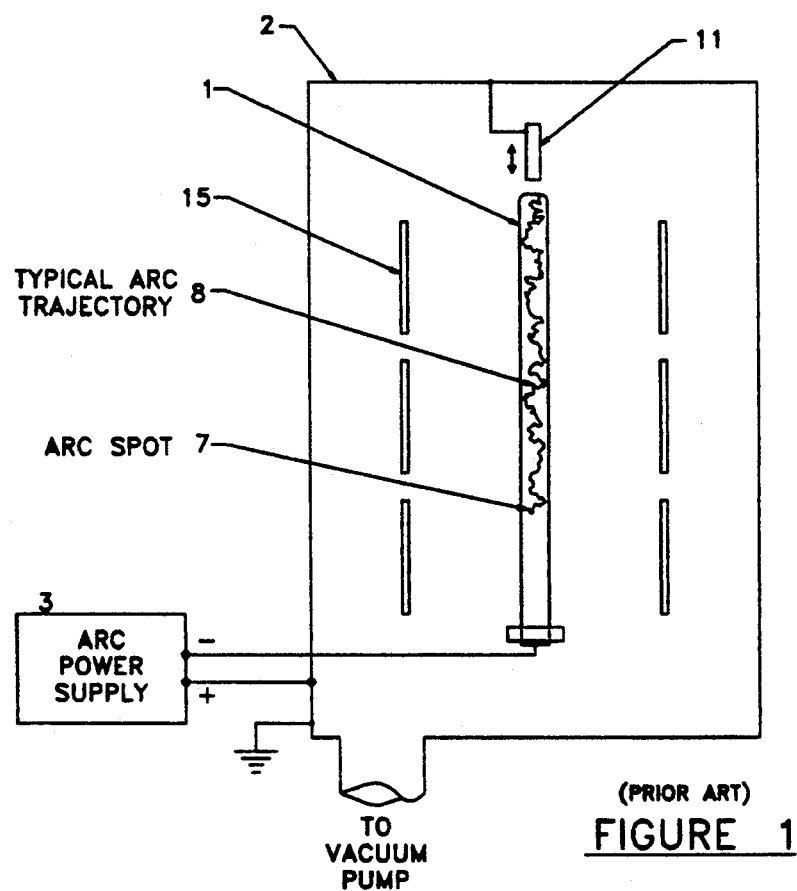
FIG. 1 is a pictorial diagram of a prior art vacuum arc evaporation apparatus illustrating the way in which the arc proceeds along the cathode in a random meandering path.
Figure 2A:
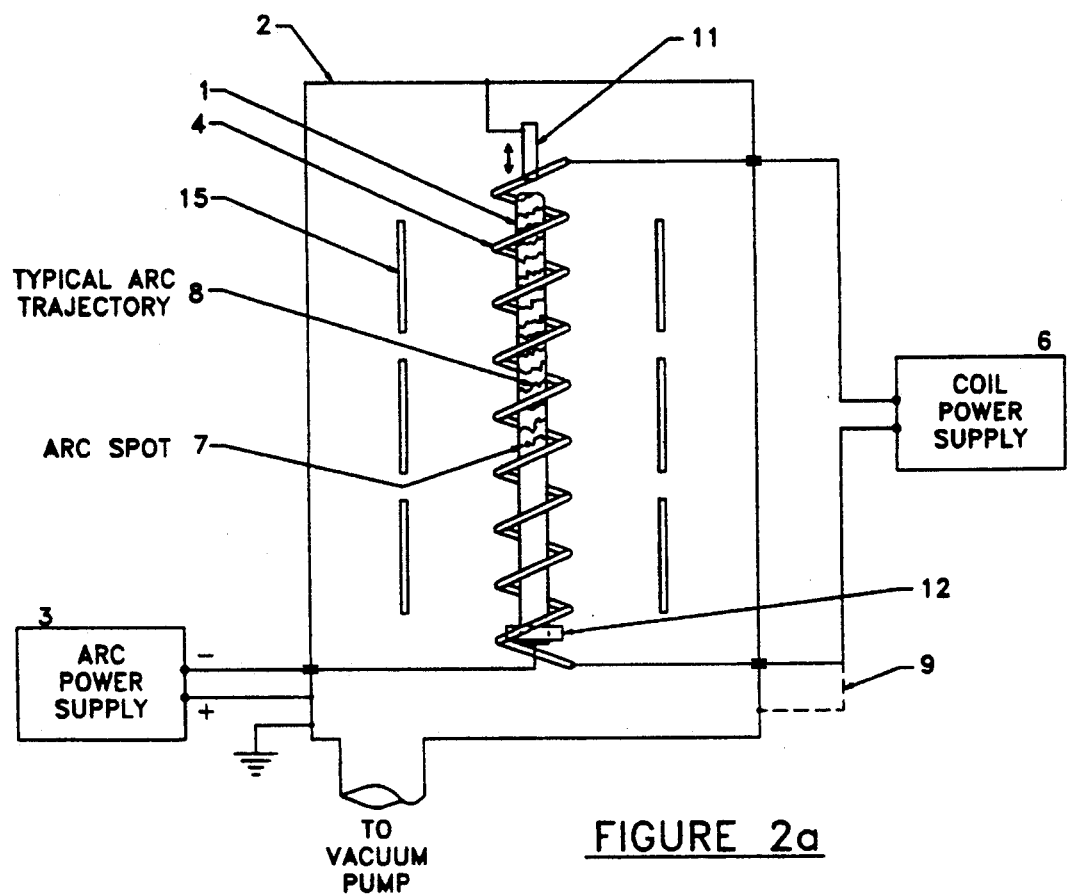
FIG. 2A is a pictorial diagram of a vacuum arc evaporation apparatus employing a rod cathode in accordance with the present invention and in which an axial magnetic field component is applied to cause the arc spot to follow a helical trajectory along the cathode.

Referring now to FIG. 2A, there is shown a rod-shaped cathode 1 mounted within a vacuum chamber 2, which serves as an anode. Cathode 1 is connected to the negative output of an arc power supply 3, and vacuum chamber 2 is connected to the positive output of arc power supply 3. An arc is struck repetitively by a striker 11, located at the end of cathode 1 that is opposite the connection to arc power supply 3. A helical electromagnet coil 4 is mounted coaxially with the cathode 1 and serves to generate a solenoidal magnetic field with flux lines substantially parallel to the cathode axis, and having a magnitude proportional to the current furnished by a coil power supply 6. One or more substrates 15, upon which a coating is to be deposited, are disposed surrounding the cathode 1 in the region surrounding helical electromagnet coil 4, and facing the evaporable surface of the cathode. Substrates 15 may be conventionally rotated and/or translated during deposition if necessary to achieve a uniform coating thereon. An arc spot 7 and a typical trajectory 8 thereof resulting from the influence of the applied magnetic field are also depicted. Arc spot 7 travels all or part of the length of the cathode 1 toward the connection to arc power supply 3 before being restruck. An insulator 12 prevents movement of the arc spot 7 off the desired evaporable surface of cathode 1.

Electromagnet coil 4 may be electrically isolated from the arc circuit, or it may comprise part of the anode by connection thereto as indicated by the dotted line 9. The electromagnet coil 4 may alternatively serve as the sole anode for the arc discharge, in which case the electromagnet coil 4 is isolated electrically from the chamber 2 and connected to the positive output of arc power supply 3, which is disconnected from chamber 2. The pitch of the electromagnet coil 4 and the diameter of the conductor from which it is fabricated are chosen to minimize the blockage of material evaporated from cathode 1. For example, with a coil constructed of ¼" diameter conductor with pitch (coil spacing) of approximately 2", a useful range of magnetic field strength is obtained with a coil current in the range of 50–500 amperes. Electromagnet coil 4 may be conveniently constructed of small diameter tubing to facilitate water cooling thereof. Striker 11 may alternatively contact the cathode on its side rather than the end, to prevent trapping the arc on the end of the cathode at high magnetic field strength.

Figure 2B:
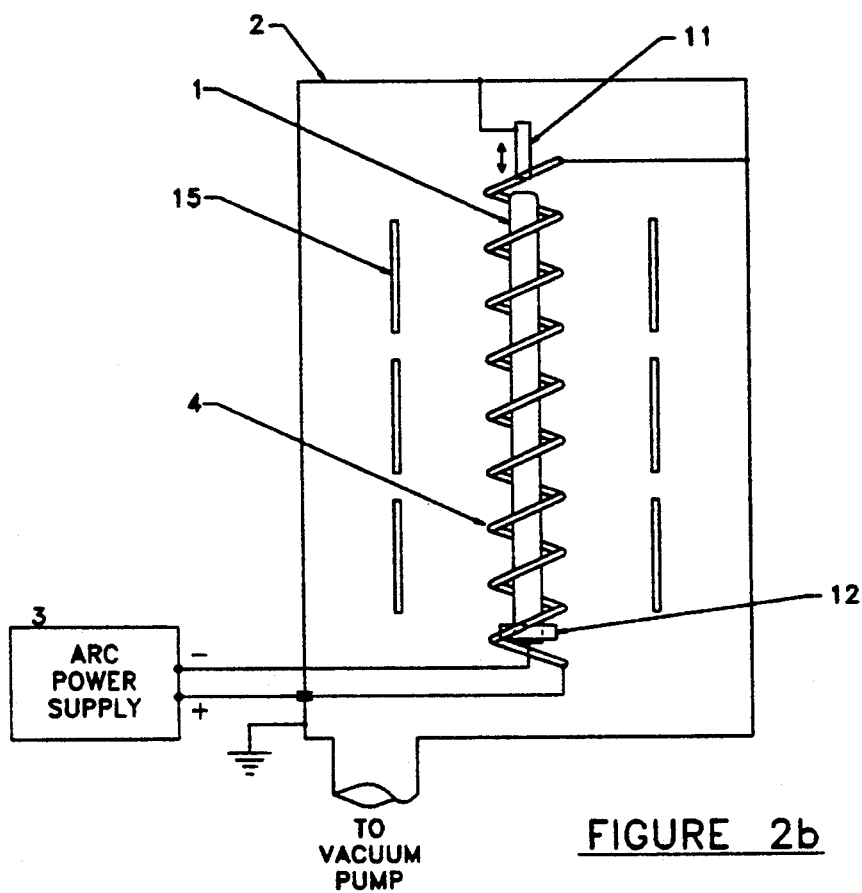
FIG. 2B is a pictorial diagram of the vacuum arc evaporation apparatus of FIG. 2A in which the electromagnet coil is connected in series with the arc power supply, thereby eliminating the need for a separate power supply for powering the electromagnet coil.

Referring now to FIG. 2B, electromagnet coil 4 is connected in series with the arc power supply 3 so that the arc current flows through electromagnet coil 4 to generate the axial magnetic field. This arrangement eliminates the necessity of a separate power supply for powering electromagnet coil 4, but sacrifices independent adjustability of the strength of the applied magnetic field except through selection of the pitch of electromagnet coil 4.

Figure 3:
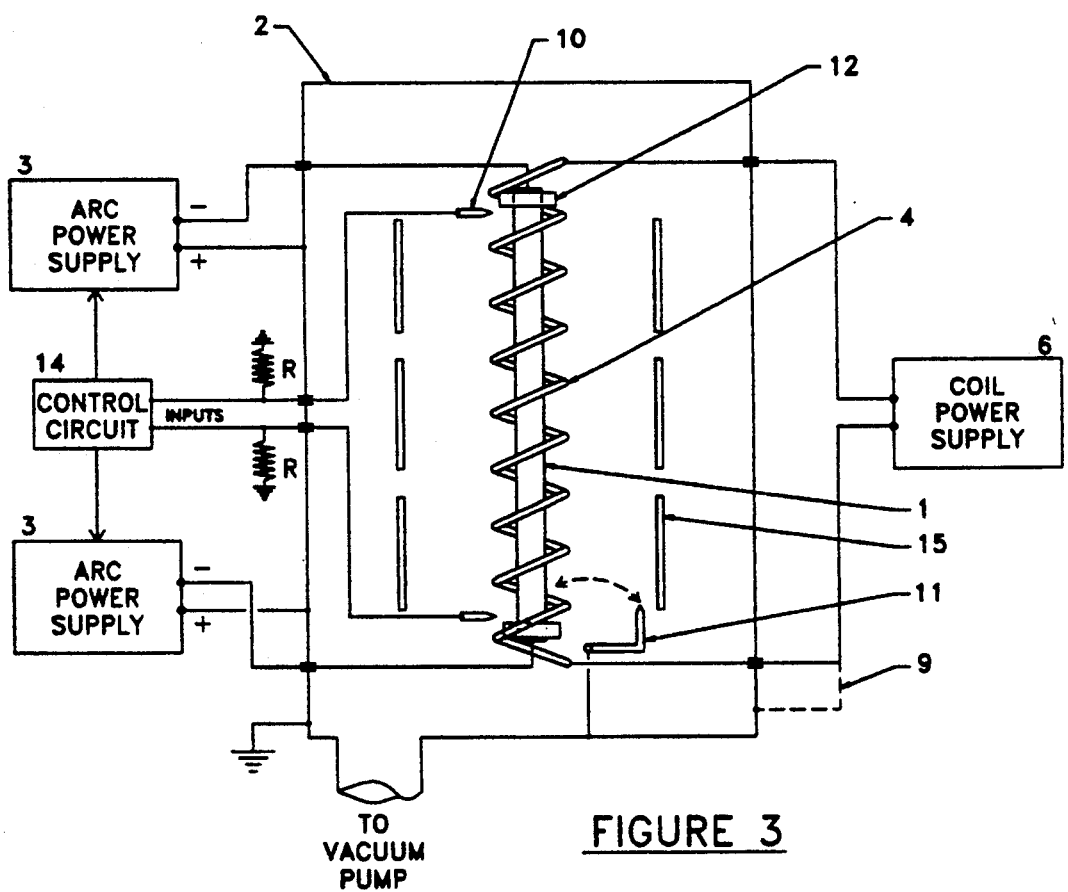
FIG. 3 is a pictorial diagram of a vacuum arc evaporation apparatus in accordance with the present invention in which current from an arc power supply is fed to both ends of a rod cathode, and in which means are provided for variably dividing the current flow between the two ends of the rod cathode, thereby facilitating control of the speed and direction of the arc spot as it progresses along a helical trajectory, to permit scanning of the arc spot reciprocally along the cathode.

Referring now to FIG. 3, there is illustrated an embodiment of the apparatus of the present invention in which the arc current is fed to both ends of rod-shaped cathode 1. Helical electromagnet coil 4 is mounted coaxially with cathode 1 and is powered by a separate coil power supply 6. Electromagnet coil 4 may be electrically isolated or it may be connected to the vacuum chamber 2, as indicated by dotted line 9. The electromagnet coil 4 may alternatively be connected as the sole anode. A control means is provided to vary the current input to each end of the cathode 1 while maintaining the total arc current substantially constant, such that the current to each end of cathode 1 may be varied between 0 and 100 percent of the total arc current supplied. This may be accomplished by using separate arc power supplies 3 connected at each end of cathode 1 with a controller 14 to provide complementary setpoint signals for the separate arc power supplies 3. Alternatively, a single arc power supply 3 having two complementary current outputs may be employed.

In the arrangement of FIG. 3, the arc tends to be drawn toward whichever end of the cathode 1 is receiving the larger fraction of the total current input, due to the self magnetic field of the arc current in the cathode 1. The speed at which the arc moves in one direction along the cathode 1 is determined by the degree of imbalance between the currents flowing into each end of cathode 1. The arc spot can therefore be scanned back and forth along the cathode 1 by varying the division of current between the two ends of cathode 1 in an oscillatory fashion. Cathode 1 can therefore be uniformly eroded, and the arc can be maintained continuously on the cathode surface, rather than being repeatedly restruck as taught by the prior art. A sensor 10 may be conveniently located at each of the ends of the evaporable surface of cathode 1 to provide a signal when the arc spot reaches one end of the evaporable surface of cathode 1, at which time the current division may be reversed, allowing automated scanning of the arc spot along the entire surface of cathode 1.

Electromagnet coil 4 may be connected in series with the arc power supply 3, such that the arc current flows through electromagnet coil 4 to generate an axial magnetic field. Since the coil is connected between the positive output of arc power supply 3 and the anode, and since the total arc current is constant, the current input to the electromagnet coil 4 is not affected by the variation in current to the two ends of cathode 1. This arrangement eliminates the necessity of a separate power supply for powering electromagnet coil 4, but sacrifices independent adjustability of the strength of the applied magnetic field except through selection of the pitch of electromagnet coil 4.

Figure 4:
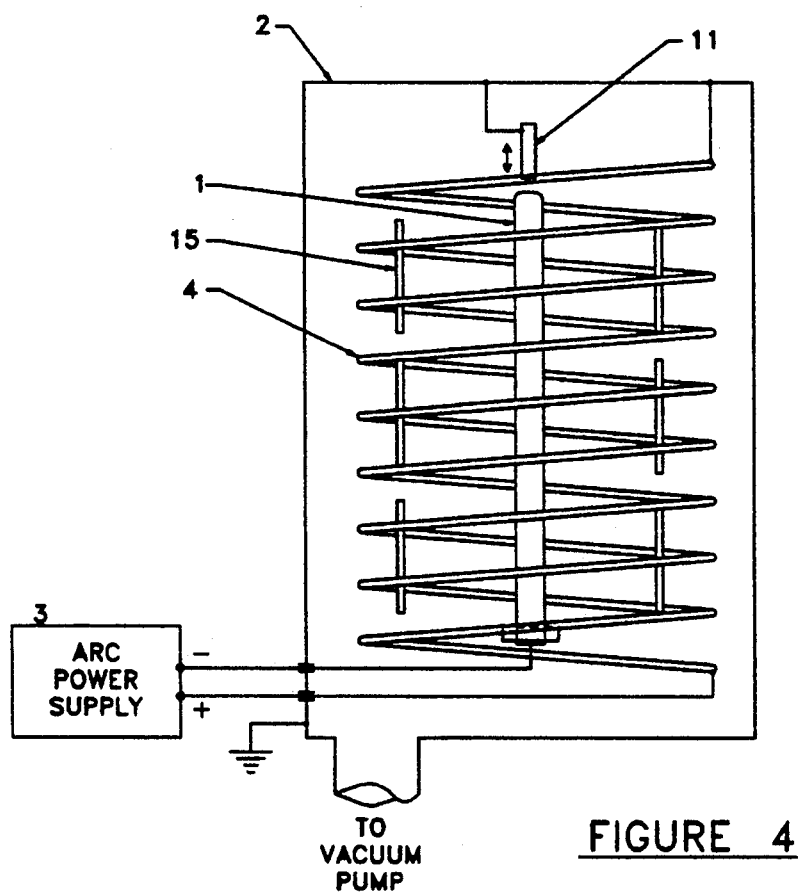
FIG. 4 is a pictorial diagram of a vacuum arc evaporation apparatus in accordance with the present invention in which a large diameter electromagnet coil is employed to permit placing substrates to be coated in the volume between the rod cathode and the electromagnet coil.

Referring now to FIG. 4, there is shown an embodiment of the present invention in which the helical electromagnet coil 4 is of sufficiently large diameter that the substrates 15 to be coated may be disposed in the region inside the electromagnet coil 4. This arrangement avoids any blockage of the evaporated material from the cathode 1 by the electromagnet coil 4. Electromagnet coil 4 may be located outside the vacuum chamber 2 for the same reason. Electrical connections between electromagnet coil 4, arc power supply 3, and the anode may be in accordance with any of the configurations of FIGS. 2A, 2B, and 3. In this case, the vacuum chamber 2 must, of course, be constructed of a non-magnetic material.

Figure 5:
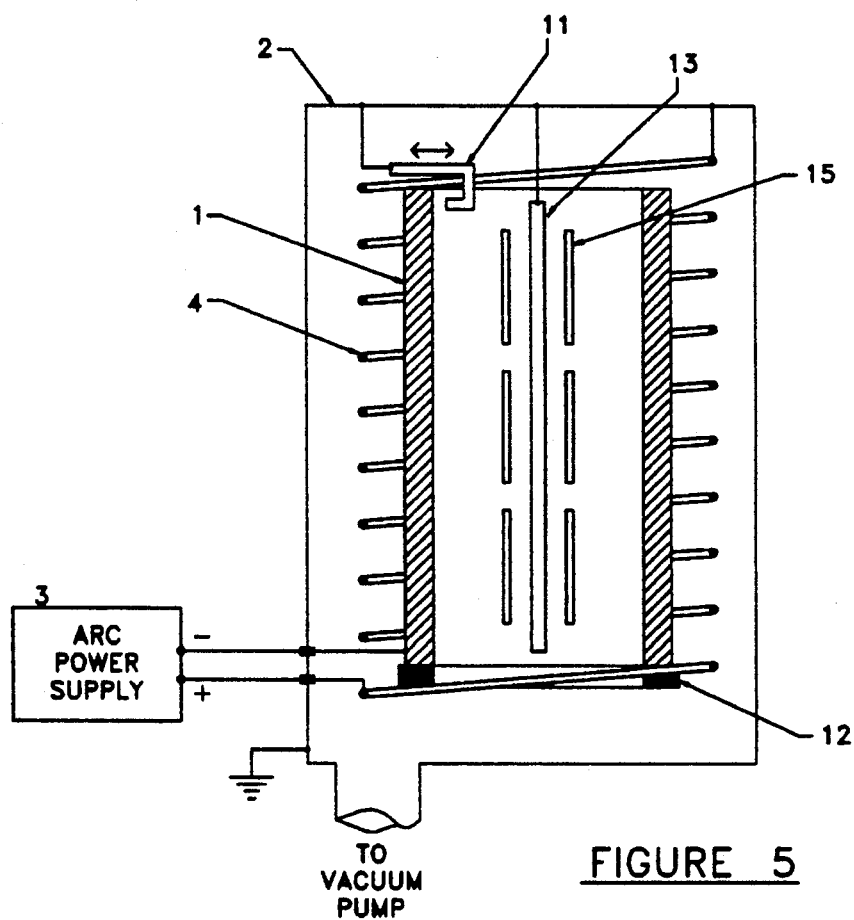
FIG. 5 is a pictorial diagram of a vacuum arc evaporation apparatus in accordance with the present invention in which a hollow cylindrical cathode is positioned within an electromagnet core and in which substrates to be coated are positioned within the hollow cylindrical cathode.

Referring now to FIG. 5, there is shown an embodiment of the present invention in which the cathode 1 has the shape of a hollow cylinder. A helical electromagnet coil 4 is mounted coaxially outside the cathode 1, such that current through the electromagnet coil 4 produces an axial magnetic field inside the cylindrical cathode 1 and parallel to its walls. The arc is struck on the inside surface 16 of the cylindrical cathode 1. The arc spot 7 follows a helical trajectory 8 around the inner surface of cylindrical cathode 1. Insulator 12 prevents movement of the arc spot 7 off the desired evaporable surface of the cathode. The arc spot 7 emits metal vapor plasma in a direction approximately toward the center of the cylindrical cathode 1. One or more substrates 15 are disposed inside the cylindrical cathode 1 with the surface thereof to be coated facing the evaporable surface (inner wall) of cylindrical cathode 1. The substrates 15 may be translated along the longitudinal axis of cylindrical cathode 1 and/or rotated during the deposition process if desirable to achieve uniformity of the coating. Connection between electromagnet coil 4, arc power supply 3, and anode 13 may be made in accordance with any of the configurations illustrated in FIGS. 2A, 2B, and 3. In the case of a cylindrical cathode 1 of considerable length, it is desirable to provide an anode structure 13 on the longitudinal axis of cylindrical cathode 1. The arc current may also be supplied to both ends of the cathode 1 in the same manner as disclosed in FIG. 3 and the corresponding description, for the same reasons.

Figure 6:
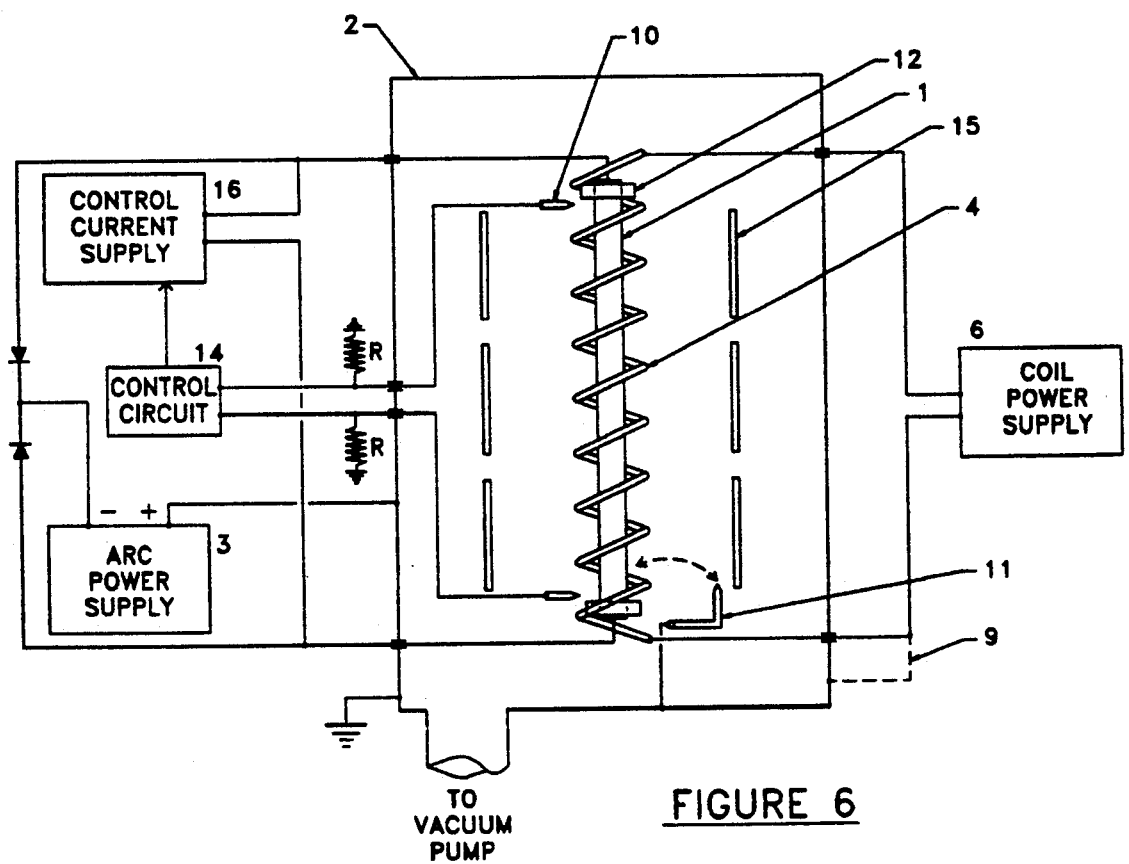
FIG. 6 is a pictorial diagram of a vacuum arc evaporation apparatus in accordance with the present invention in which the arc current is supplied equally to both ends of the cathode, and in which an independent power supply is provided to supply a control current to the cathode to thereby generate a circumferential magnetic field component that is adjustable independent of the arc current.

Referring now to FIG. 6, there is shown an embodiment of the present invention in which the negative output of the arc power supply 3 is connected to both ends of cathode 1 in parallel, such that the current supplied to each end of the cathode is substantially the same. The outputs of control power supply 16 are connected to opposite ends of the cathode, such that the control current passes through the cathode from one end to the other, thus creating a circumferential magnetic field component over the entire cathode surface. Electrical connections between electromagnet coil 4, arc power supply 3, and the anode may be in accordance with any of the configurations illustrated in FIGS. 2A, 2B, and 3. Since the control power supply is not part of the cathode-anode circuit, variations in the magnitude and direction of the control current do not affect the arc current.

Referring now to FIGS. 2A, 2B, 3, and 4, and to the above detailed description thereof, it will be understood that vacuum chamber 2 may itself comprise the substrate to be coated. The present invention may thus be employed, for example, for coating the inside of a pressure or vacuum vessel, or the inside of an evacuated pipe or tube.

Referring now generally to all of the drawing figures and to the above detailed description thereof, it will be further understood that instead of or in addition to moving the substrates during deposition to achieve uniformity of the coating, it may be desirable to move the cathode in a direction parallel or perpendicular to its longitudinal axis. This enables, for example, the coating of large substrates. The means for generating the magnetic field of the present invention may or may not be moved along with the cathode.

The embodiments of the present invention which have been described in detail are disclosed only for purposes of illustration, and not for limitation. The present invention is not limited in its application to the details of particular arrangements shown. For example, means for generating the magnetic field of the present invention may comprise apparatus other than a helical electromagnet coil. Similarly, the terminology used herein is for the purpose of description rather than limitation.

I claim:

1. A vacuum arc discharge apparatus for vaporizing a material and for depositing a coating of said material onto a substrate, the apparatus comprising:
    a vacuum chamber;
    vacuum pump means coupled to said vacuum chamber for establishing a desired atmosphere within said vacuum chamber;
    a cylindrical cathode positioned within said vacuum chamber, said cylindrical cathode having an evaporable surface comprising said material, said evaporable surface facing a region in which the substrate to be coated is located;

first magnetic field means for generating an axial magnetic field component over said evaporable surface of said cylindrical cathode, said axial magnetic field component having flux lines over all of said evaporable surface that are substantially parallel to the longitudinal axis of said cylindrical cathode;

second magnetic field means for generating a circumferential magnetic field component over at least a portion of said evaporable surface of said cylindrical cathode, said second magnetic field means including means for controlling said circumferential magnetic field component independently of an arc current, said circumferential magnetic field component having flux lines that are substantially parallel to said evaporable surface and perpendicular to the longitudinal axis of said cylindrical cathode at a given location on said evaporable surface;

anode means;

arc power supply means for supplying said arc current; and striker means for striking a moving arc between said cylindrical cathode and said anode means, said moving arc moving in an open helical path over the evaporable surface of said cylindrical cathode, a direction and speed of said moving arc being determined by a vector combination of said axial and circumferential magnetic field components.

2. A vacuum arc discharge apparatus as in claim 1 wherein said first magnetic field means comprises a helical electromagnetic coil coaxially aligned with said cylindrical cathode and positioned outside said cylindrical cathode.

3. A vacuum arc discharge apparatus as in claim 2 wherein said cylindrical cathode is connected to a negative output of said arc power supply means, one end of said helical electromagnet coil is connected to a positive output of said arc power supply means, and the other end of said helical electromagnet coil is connected to said anode means.

4. A vacuum arc discharge apparatus as in claim 2 further comprising coil power supply means electrically connected to said helical electromagnet coil.

5. A vacuum arc discharge apparatus as in claim 4 wherein said electromagnetic coil is electrically isolated from said anode means.

6. A vacuum arc discharge apparatus as in claim 4 wherein said electromagnetic coil is electrically connected to said anode means.

7. A vacuum arc discharge apparatus as in claim 4 wherein said electromagnetic coil comprises said anode means.

8. A vacuum arc discharge apparatus as in claim 1 wherein said second magnetic field means comprises an electrical connection between said arc power supply means and said cylindrical cathode such that said arc current produces said circumferential magnetic field component over at least a portion of the length of said cylindrical cathode.

9. A vacuum arc discharge apparatus as in claim 8 wherein said arc power supply means is electrically connected to both ends of said cylindrical cathode and said apparatus further comprises current control means for varying the fraction of the arc current supplied by said arc power supply means that flows to each end of said cylindrical cathode within a range of 10% to 90% of said arc current.

10. A vacuum arc discharge apparatus as in claim 9 further comprising current sensor means positioned at end boundaries of said evaporable surface of said cylindrical cathode for sensing the presence of arc spots, said current control means being responsive to signals from said current sensor means indicative of the presence of said arc spots, for controlling said current control means to vary the fraction of arc current flowing to each end of said cylindrical cathode to thereby cause said arc spots to move with oscillatory motion from one end of said cylindrical cathode to the other end thereof.

11. A vacuum arc discharge apparatus as in claim 10 wherein said arc power supply means comprises a pair of separate arc power supplies and wherein said current control means is coupled to receive said signals from said current sensor means, said current control means being responsive to said signals for providing complementary current setpoint signals to each of said pair of separate arc power supplies.

12. A vacuum arc discharge apparatus as in claim 1 wherein said second magnetic field means comprises control current power supply means connected to both ends of said cylindrical cathode for producing a control current that flows through said cylindrical cathode from one end thereof to the other independent of said arc current, said control current generating said circumferential magnetic field component over said evaporable surface of said cylindrical cathode.

13. A vacuum arc discharge apparatus as in claim 1 wherein said evaporable surface of said cylindrical cathode comprises an outer surface thereof and wherein said substrate is positioned outside said cylindrical cathode and outside said first magnetic field means.

14. A vacuum arc discharge apparatus as in claim 1 wherein said evaporable surface of said cylindrical cathode comprises an outer surface thereof and wherein said substrate is positioned outside said cylindrical cathode but within said first magnetic field means.

15. A vacuum arc discharge apparatus as in claim 1 wherein:
said cylindrical cathode comprises a hollow cylinder and said evaporable surface of said cylindrical cathode comprises the inner surface thereof;
said first magnetic field means is positioned outside said cylindrical cathode; and
said substrate is positioned within said cylindrical cathode facing the evaporable surface.

16. A vacuum arc discharge apparatus as in claim 1 wherein said cylindrical cathode is of circular cross section.

17. A vacuum arc discharge apparatus as in claim 1 wherein said cylindrical cathode is of polygonal cross section.

18. A vacuum arc discharge apparatus as in claim 1 wherein said evaporable surface comprises one or more replaceable elements containing said material.

19. A vacuum arc discharge apparatus as in claim 1 wherein at least a portion of said vacuum chamber comprises the substrate to be coated.

* * * * *